(12) United States Patent
Shinojima et al.

(10) Patent No.: US 11,778,730 B1
(45) Date of Patent: Oct. 3, 2023

(54) PRINTED CIRCUIT BOARD AND WIRELESS COMMUNICATION TERMINAL

(71) Applicant: FCNT LIMITED, Yamato (JP)

(72) Inventors: Takahiro Shinojima, Yamato (JP); Hirofumi Sakamoto, Yamato (JP); Yohei Koga, Yamato (JP); Manabu Yoshikawa, Yamato (JP); Fuyuki Hikita, Yamato (JP)

(73) Assignee: FCNT LIMITED, Yamato (JP)

( * ) Notice: Subject to any disclaimer, the term of this patent is extended or adjusted under 35 U.S.C. 154(b) by 0 days.

(21) Appl. No.: 18/143,752

(22) Filed: May 5, 2023

(30) Foreign Application Priority Data

Aug. 15, 2022 (JP) ................................ 2022-129376

(51) Int. Cl.
*H01L 23/66* (2006.01)
*H01Q 9/04* (2006.01)
*H01Q 9/06* (2006.01)
*H05K 1/02* (2006.01)
*H05K 1/11* (2006.01)
*H05K 3/18* (2006.01)

(52) U.S. Cl.
CPC ......... *H05K 1/0218* (2013.01); *H05K 1/0243* (2013.01); *H05K 1/115* (2013.01); *H05K 3/18* (2013.01); *H05K 2201/10098* (2013.01)

(58) Field of Classification Search
None
See application file for complete search history.

(56) References Cited

U.S. PATENT DOCUMENTS

| | | | | |
|---|---|---|---|---|
| 6,441,471 B1* | 8/2002 | Maetani | ................. | H01P 1/047 257/691 |
| 6,583,498 B1* | 6/2003 | Pillai | ..................... | H05K 1/025 257/664 |
| 6,849,924 B2* | 2/2005 | Allison | ................. | H01H 67/22 257/750 |
| 6,961,230 B2* | 11/2005 | Otsuka | .................. | H01G 2/065 361/321.1 |
| 7,030,712 B2* | 4/2006 | Brunette | ............. | H05K 1/0222 333/260 |

(Continued)

FOREIGN PATENT DOCUMENTS

| | | |
|---|---|---|
| JP | 2002-231849 A | 8/2002 |
| JP | 2005-311337 A | 11/2005 |
| JP | 2016-181737 A | 10/2016 |

OTHER PUBLICATIONS

Notice of Reasons for Refusal dated Nov. 15, 2022, issued in counterpart JP Application No. 2022-129376, with English translation. (4 pages).

*Primary Examiner* — Tuan A Tran
(74) *Attorney, Agent, or Firm* — WHDA, LLP

(57) ABSTRACT

A printed circuit board includes a dielectric substrate which is formed in a plate-like shape, ground conductor layers which are respectively provided on a top surface and a back surface of the dielectric substrate, a signal line which is provided on a side surface of the dielectric substrate, and transmits a high frequency signal, and a plurality of connection conductors which are provided in the dielectric substrate, connects the ground conductor layer provided on the top surface and the ground conductor layer provided on the back surface, and are aligned and disposed along the signal line.

18 Claims, 23 Drawing Sheets

(56) References Cited

U.S. PATENT DOCUMENTS

| | | | | |
|---|---|---|---|---|
| 7,145,428 | B2* | 12/2006 | Chiu | H05K 1/165 336/200 |
| 7,436,056 | B2* | 10/2008 | Cheung | H01L 23/49838 257/E23.079 |
| 7,851,895 | B2* | 12/2010 | Huang | H01P 3/08 257/664 |
| 8,575,730 | B2* | 11/2013 | Nakashiba | H01L 23/5227 257/422 |
| 9,917,026 | B2* | 3/2018 | Oikawa | H01L 23/49811 |
| 10,141,273 | B2* | 11/2018 | Watanabe | H01L 24/42 |
| 10,159,144 | B2* | 12/2018 | Kariyazaki | H05K 1/0248 |
| 10,326,205 | B2* | 6/2019 | Haziza | H01Q 1/50 |
| 10,347,552 | B2* | 7/2019 | Oikawa | H01L 25/07 |
| 10,827,614 | B2* | 11/2020 | Imi | H05K 1/115 |
| 11,277,949 | B2 | 3/2022 | Yun et al. | |
| 11,322,429 | B2* | 5/2022 | Maeda | H05K 1/0215 |
| 11,437,734 | B2* | 9/2022 | Goto | H01Q 21/12 |
| 11,605,584 | B2* | 3/2023 | Suk | H01L 23/5383 |
| 11,605,869 | B2* | 3/2023 | Baba | H05K 1/0242 |
| 11,631,933 | B2* | 4/2023 | Asaka | H01Q 9/0457 343/700 R |
| 2007/0040735 | A1 | 2/2007 | Matsuo et al. | |
| 2019/0313529 | A1 | 10/2019 | Kim et al. | |
| 2020/0014113 | A1* | 1/2020 | Asaka | H01Q 9/0414 |

* cited by examiner

PRINTED CIRCUIT BOARD AND WIRELESS COMMUNICATION TERMINAL

CROSS-REFERENCE TO RELATED APPLICATION

This application is based upon and claims the benefit of priority of the prior Japanese Patent Application No. 2022-129376, filed on Aug. 15, 2022, the entire contents of which are incorporated herein by reference.

FIELD

The embodiments discussed herein are related to a printed circuit board and a wireless communication terminal.

BACKGROUND

An integration circuit such as an Integrated Circuit (IC) is disposed in a center area of the printed circuit board, and a signal line for transmitting a high frequency signal (RF signal) is usually disposed at an outer circumferential part of the printed circuit board (see, for example, Patent document 1 and 2).

[Patent document 1] Japanese Laid-open Patent Publication No. 2005-311337

[Patent document 2] Japanese Laid-open Patent Publication No. 2002-231849

SUMMARY

According to an aspect of the embodiments, a printed circuit board includes: a dielectric substrate which is formed in a plate-like shape; ground conductor layers which are respectively provided on a top surface and a back surface of the dielectric substrate; a signal line which is provided on a side surface of the dielectric substrate, and transmits a high frequency signal; and a plurality of connection conductors which are provided in the dielectric substrate, connects the ground conductor layer provided on the top surface and the ground conductor layer provided on the back surface, and are aligned and disposed along the signal line.

The object and advantages of the invention will be realized and attained by means of the elements and combinations particularly pointed out in the claims. It is to be understood that both the foregoing general description and the following detailed description are exemplary and explanatory and are not restrictive of the invention.

DESCRIPTION OF THE PREFERRED EMBODIMENTS

A signal line for transmitting an RF signal is designed together with a ground wiring for suitable impedance control. However, disposing a signal line at a board outer circumferential part makes an electromagnetic field, which is between the signal line and the ground wiring, unstable, and a negative influence occurs, i.e., a ripple is produced in a signal to be transmitted.

An object of one aspect of technique disclosed is to provide a printed circuit board and a wireless communication terminal which can suppress a ripple produced in a signal to be transmitted even when a signal line for transmitting a high frequency signal is disposed at a board outer circumferential part.

EMBODIMENT

A configuration according to an embodiment described below is exemplary, and the disclosed technique is not limited to the configuration of the embodiment. A printed circuit board according to the embodiment employs, for example, a following configuration. The printed circuit board according to the present embodiment includes a dielectric substrate which is formed in a plate-like shape, ground conductor layers which are respectively provided on a top surface and a back surface of the dielectric substrate, a signal line which is provided on a side surface of the dielectric substrate, and transmits a high frequency signal, and a plurality of connection conductors which are provided in the dielectric substrate, connects the ground conductor layer provided on the top surface and the ground conductor layer provided on the back surface, and are aligned and disposed along the signal line.

According to the printed circuit board, the ground conductor layer provided on the top surface of the dielectric substrate and the ground conductor layer provided on the back surface are electrically connected by connection conductors. Consequently, it is possible to make a ground seen from the signal line larger. As a result, it is possible to stabilize an electric field between the signal line and the ground conductor layers as much as possible, and eventually improve characteristics of the signal line for transmitting a high frequency signal. As a result, it is possible to suppress a ripple of a high frequency signal transmitted through the signal line as much as possible.

Figure 1:
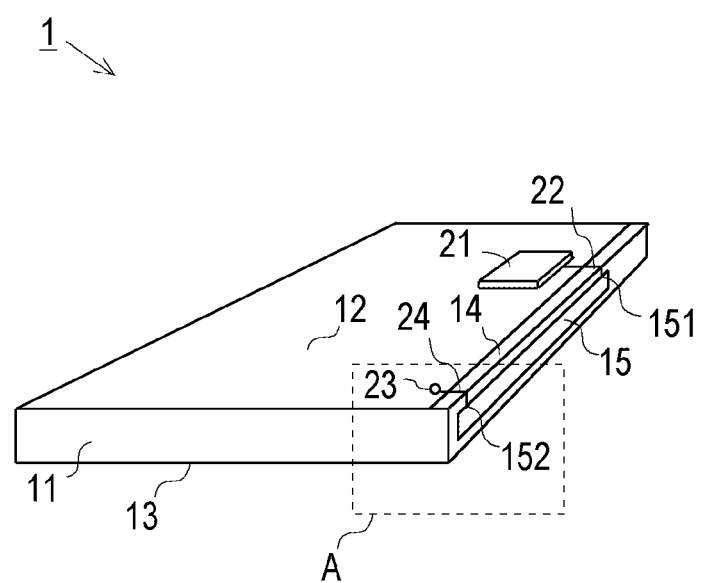
FIG. 1 is a view illustrating an example of a printed circuit board according to an embodiment.

The embodiment of the above printed circuit board will be further described below with reference to the drawings. FIG. 1 is a view illustrating an example of a printed circuit board 1 according to the embodiment. The printed circuit board 1 includes a dielectric substrate 11, a first ground surface 12, a second ground surface 13, an RF signal line 15, an RF circuit 21, a circuit connection line 22, an antenna spring contact 23, and an antenna connection line 24.

The printed circuit board 1 is a board which includes the dielectric substrate 11 formed in a plate-like shape. The dielectric substrate 11 is formed by a dielectric such as paper, glass, ceramics, or the like. A relative permittivity of the dielectric substrate 11 is, for example, approximately 2.0 to 10.0. The first ground surface 12 and the second ground surface 13 are provided on a top surface and a back surface of the dielectric substrate 11, respectively. The first ground surface 12 and the second ground surface 13 are formed by, for example, a conductor plate such as a copper foil. The first ground surface 12 and the second ground surface 13 are used to ground an electronic part such as the RF circuit 21 mounted on the printed circuit board 1, and the RF signal line 15. The printed circuit board 1 is an example of the "printed circuit board". The dielectric substrate 11 is an example of the "dielectric substrate". The first ground surface 12 and the second ground surface 13 are examples of the "ground conductor layers".

The antenna spring contact 23 is a spring contact connected with an antenna. The antenna spring contact 23 is connected with a port 152 of the RF signal line 15 by the antenna connection line 24. The RF circuit 21 is a circuit which processes a high frequency signal transmitted and received by the antenna connected to the antenna spring contact 23. The RF circuit 21 is connected to a port 151 of the RF signal line 15 by the circuit connection line 22. The antenna spring contact 23 is an example of the "antenna contact". The RF circuit 21 is an example of the "processing circuit".

The RF signal line 15 is provided on a side surface of the dielectric substrate 11. The RF signal line 15 is formed by, for example, plating. The RF signal line 15 is formed by, for example, a conductor such as copper. Although FIG. 1 illustrates the RF signal line 15 formed in a plate-like shape, the shape of the RF signal line 15 is not limited to the plate-like shape. The RF signal line 15 transmits a high frequency signal to be transferred between the antenna spring contact 23 and the RF circuit 21. Furthermore, an end part of the first ground surface 12 on the RF signal line 15 side is provided with a substrate exposed part 14. The substrate exposed part 14 is an area in which a top surface of the dielectric substrate 11 is exposed without being provided with a conductor or the like. Providing the substrate exposed part 14 suppresses the first ground surface 12 and the RF signal line 15 from being electrically connected. Note that, although not illustrated in FIG. 1, the part at which the top surface of the dielectric substrate 11 is exposed is provided between the second ground surface 13 and the RF signal line 15, too. The RF signal line 15 is an example of the "signal line".

Figure 2:
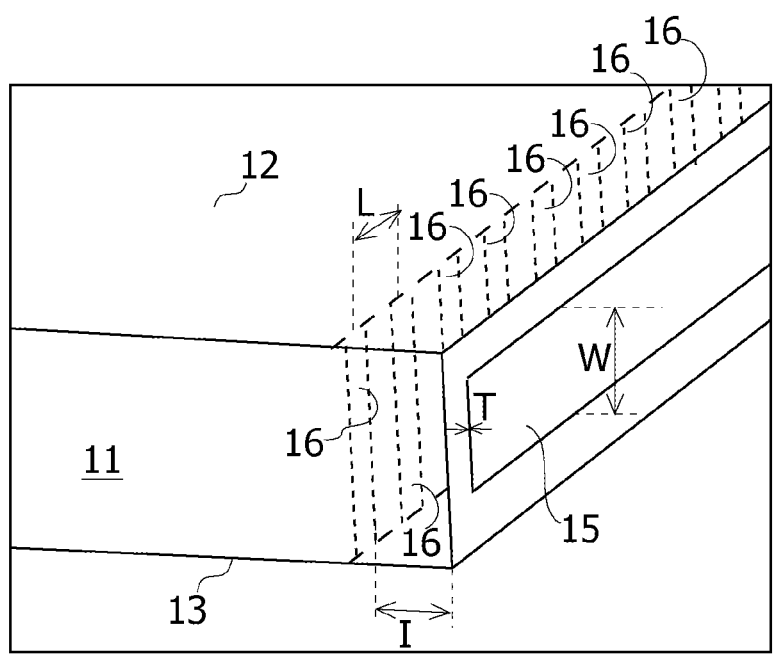
FIG. 2 is a view illustrating an enlarged area of a rectangle A in FIG. 1.

FIG. 2 is a view illustrating an enlarged area of a rectangle A in FIG. 1. In FIG. 2, the antenna spring contact 23 and the antenna connection line 24 are omitted for the sake of convenience. Furthermore, in FIG. 2, intra-substrate wirings 16 disposed in the dielectric substrate 11 near the RF signal line 15 are also illustrated as dotted lines.

The intra-substrate wiring 16 is a wiring which is disposed in the dielectric substrate 11 and connects the first ground surface 12 and the second ground surface 13. The intra-substrate wirings 16 are provided in, for example, vias and through-holes formed in a thickness direction of the dielectric substrate 11. Furthermore, the intra-substrate wirings 16 may be provided by being driven into the dielectric substrate 11.

The plurality of intra-substrate wirings 16 are aligned and provided at predetermined intervals along the RF signal line 15. The intra-substrate wirings 16 are aligned and disposed, for example, in parallel to the RF signal line 15. The first ground surface 12 and the second ground surface 13 are connected by the intra-substrate wirings 16, and thereby are seen as one large ground from the RF signal line 15. The intra-substrate wirings 16 are examples of the "connection conductors".

A distance I between the RF signal line 15 and the intra-substrate wirings 16 is, for example, 5.0 mm or less. A distance L between the adjacently disposed intra-substrate wirings 16 (a distance between centers of the adjacently disposed intra-substrate wirings 16) is, for example, 0.5 mm or less. A width W of the RF signal line 15 is in a range of, for example, 0.1 mm to 10.0 mm. A thickness T of the RF signal line 15 is, for example, 0.1 mm or less.

Simulation

Simulation was conducted to inspect characteristics of the printed circuit board 1. Simulation results will be described below with reference to the drawings.

First Simulation

Figure 3:
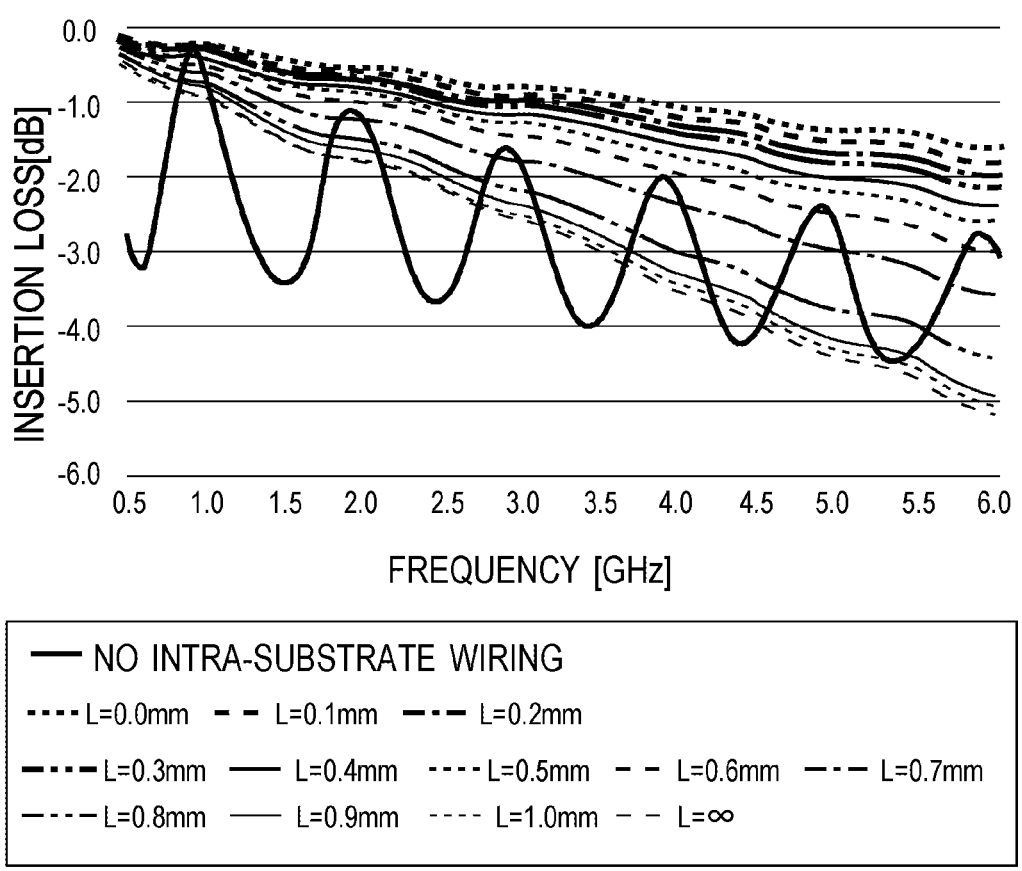
FIG. 3 is a view illustrating a first simulation result obtained by checking insertion loss in a case where a distance L between adjacently disposed intra-substrate wirings is varied, and a signal is transmitted to an RF signal line.

FIG. 3 is a view illustrating a first simulation result obtained by checking insertion loss in a case where the distance L between the adjacently disposed intra-substrate wirings 16 was varied, and a signal was transmitted through the RF signal line 15. A vertical axis in FIG. 3 indicates insertion loss (dB), and a horizontal axis indicates a frequency of a signal to be transmitted. Furthermore, according to the first simulation whose result is illustrated in FIG. 3, insertion losses which occurred in a case where a signal was transmitted through the RF signal line 15 was measured in a case of a state where there was no intra-substrate wiring 16, and a case where the distance L was 0 mm, 0.1 mm, 0.2 mm, 0.3 mm, 0.4 mm, 0.5 mm, 0.6 mm, 0.7 mm, 0.9 mm, 1.0 mm, and co.

In view of FIG. 3, it can be understood that, in the state where there is no intra-substrate wiring 16, a ripple where insertion loss changes greatly waving is produced according to a frequency of a signal to be transmitted. On the other hand, it can be understood that providing the intra-substrate wirings 16 suppresses the ripple. In this regard, taking the insertion loss into account, it can be understood that making the distance L 0.5 mm or less makes transmission characteristics of the RF signal line 15 preferable characteristics compared to the state where there is no intra-substrate wiring 16.

Second Simulation

Figure 4:
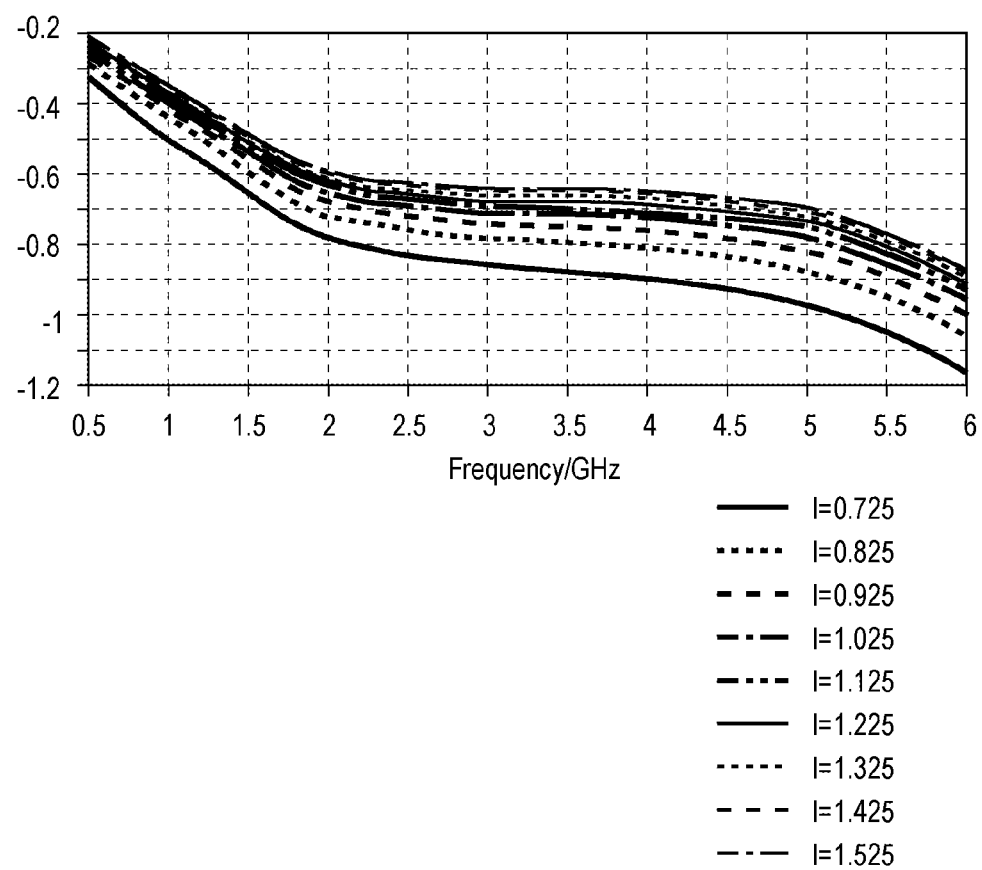
FIG. 4 is a view illustrating a second simulation result obtained by checking S21 of an RF signal line in a case where a distance I between the RF signal line and the intra-substrate wiring is varied.

FIG. 4 is a view illustrating a second simulation result obtained by checking S21 of the RF signal line 15 in a case where the distance I between the RF signal line 15 and the intra-substrate wirings 16 was varied. A vertical axis in FIG. 4 indicates S21 (dB), and a horizontal axis indicates a frequency (Hz). Furthermore, according to the second simulation whose result is illustrated in FIG. 4, S21 in a case where a signal was transmitted through the RF signal line 15 was measured in a case where the distance I was 0.725 mm, 0.825 mm, 0.925 mm, 1.025 mm, 1.125 mm, 1.225 mm, 1.325 mm, 1.425 mm, and 1.525 mm. In view of FIG. 4, it can be understood that, when the distance I is 0.925 mm or less, S21 is −1 dB or less. Furthermore, it can be understood that, when the distance I is 1.1 mm or more, an effect obtained by providing the intra-substrate wirings 16 lowers. Therefore, it can be understood that the distance I between the RF signal line 15 and the intra-substrate wirings 16 is preferably 1.1 mm or less, and is more preferably 0.925 mm or less.

Third Simulation

Figure 5:
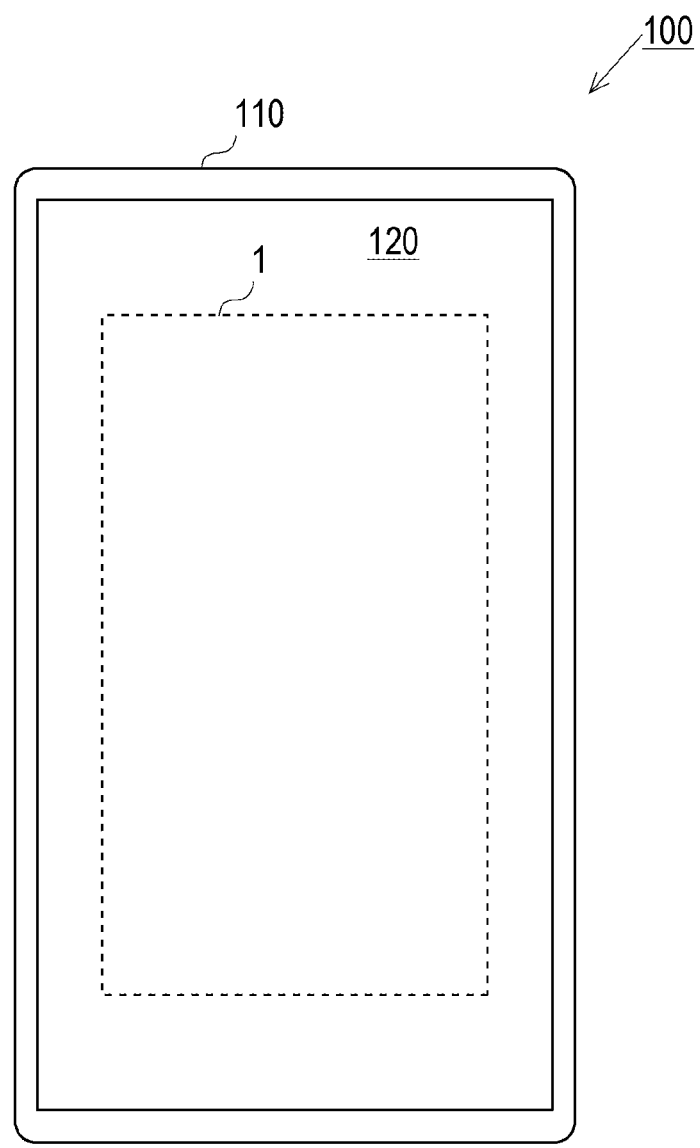
FIG. 5 is a view illustrating an example of a smartphone on which the printed circuit board is mounted.

The printed circuit board 1 can be applied to, for example, a wireless communication terminal such as a smartphone. FIG. 5 is a view illustrating an example of a smartphone 100 on which the printed circuit board 1 is mounted. In FIG. 5, the printed circuit board 1 accommodated in a housing 110 of the smartphone 100 is also illustrated as a dotted line.

In this regard, in a case where the printed circuit board 1 is applied to the smartphone 100, a metal such as the housing 110 of the smartphone 100 or a sheet metal of a back surface of a display 120 is disposed near the printed circuit board 1. Hence, third simulation is conducted on an influence on characteristics of the RF signal line 15 caused by disposing this metal as below with reference to the drawings. The smartphone 100 is an example of the "wireless communication terminal".

Figure 6:
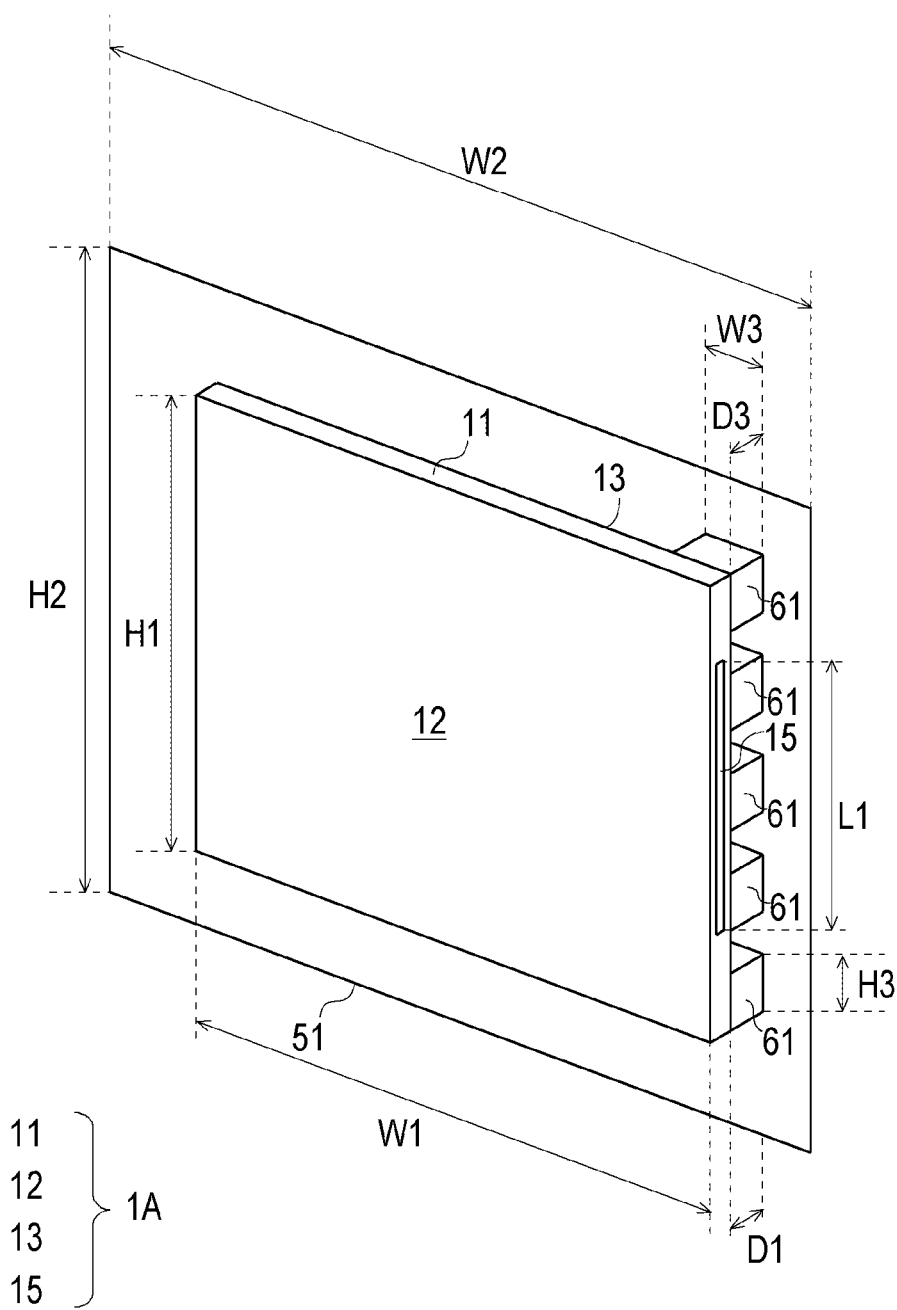
FIG. 6 is a view for explaining each parameter of third simulation.

FIG. 6 is a view for explaining each parameter of the third simulation. Instead of the printed circuit board 1, the third simulation adopts a printed circuit board 1A which includes the first ground surface 12 and the second ground surface 13 provided on both top and back surfaces of the dielectric substrate 11, and the RF signal line 15 disposed on the side surface of the dielectric substrate 11. Similar to the printed circuit board 1, in the printed circuit board 1A, the first ground surface 12 and the second ground surface 13 are electrically connected by the intra-substrate wirings 16. The printed circuit board 1A is the printed circuit board formed by removing from the printed circuit board 1 the substrate exposed part 14, the RF circuit 21, the circuit connection line 22, the antenna spring contact 23, and the antenna connection line 24. Furthermore, a sheet metal 51 assumed as a metal member such as a sheet metal of, for example, a case of a housing or a display of a smartphone is disposed on a back surface (a surface on the second ground surface 13 side) of the printed circuit board 1A.

According to the third simulation, a width W1 of the printed circuit board 1A is set to 60 mm, a height H1 of the printed circuit board 1A is set to 50 mm, and a length L1 of the RF signal line 15 is set to 30 mm. Furthermore, a width W2 of the sheet metal 51 is set to 70 mm, and a height H2 is set to 70 mm. Furthermore, an interval D1 between the printed circuit board 1A and the sheet metal 51 is set to 0.5 mm.

According to the third simulation, a plurality of connection members 61 are further provided between the printed circuit board 1A and the sheet metal 51. The connection members 61 are disposed near the side surface of the dielectric substrate 11 provided with the RF signal line 15. The connection members 61 are formed by conductors such as metals, and electrically connect the second ground surface 13 of the printed circuit board 1A and the sheet metal 51. Examples of the connection members 61 include metal screws and Mefit.

The third simulation adopts the connection members 61 whose height H3 and width W3 are 1.0 mm and whose thickness D3 is 0.5 mm. The second ground surface 13 and the first ground surface 12 are electrically connected by the intra-substrate wirings 16, and, therefore, by providing the connection members 61, the first ground surface 12, the second ground surface 13, and the sheet metal 51 are electrically connected. The connection members 61 are examples of the "connection members".

Figure 7:
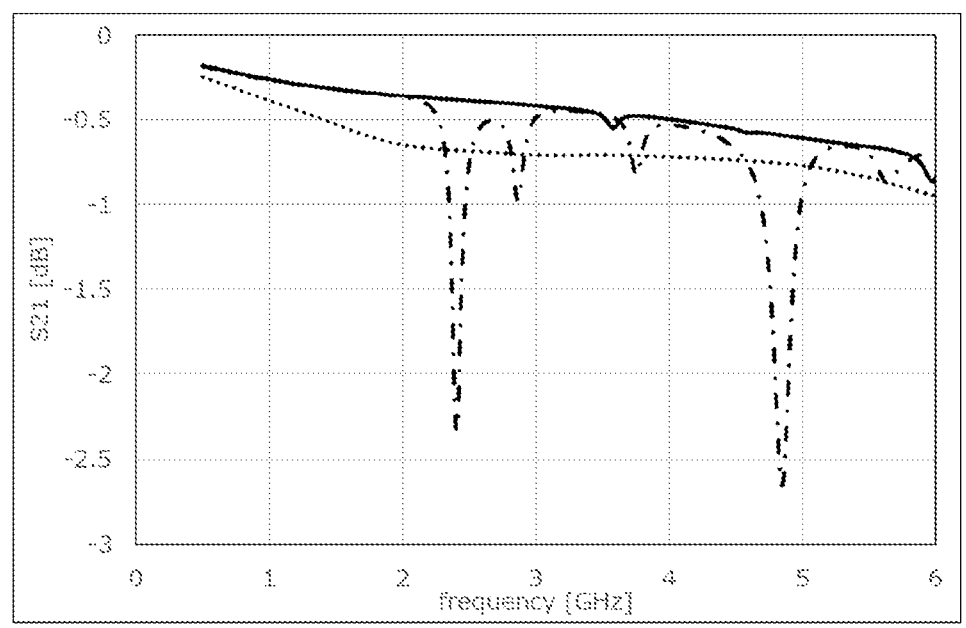
FIG. 7 is a first view illustrating a third simulation result.

FIG. 7 is a first view illustrating a third simulation result. FIG. 7 illustrates simulation of S21 (dB) in a case where a high frequency signal was transmitted through the RF signal line 15. A vertical axis in FIG. 7 indicates S21 (dB), and a horizontal axis indicates a frequency (GHz). In FIG. 7, a solid line indicates a state where the sheet metal 51 is provided and the connection members 61 are provided at five portions, a dotted line indicates a state where no sheet metal 51 is provided, and a dashed-dotted line indicates a state where the sheet metal 51 is provided and no connection member 61 is provided. As is understandable in view of FIG. 7, it can be understood that providing the sheet metal 51 in a state where there is no connection member 61 produces a ripple. Furthermore, it can be understood that the connection members 61 electrically connect the first ground surface 12, the second ground surface 13, and the sheet metal 51, so that it is possible to suppress a ripple.

Figure 8:
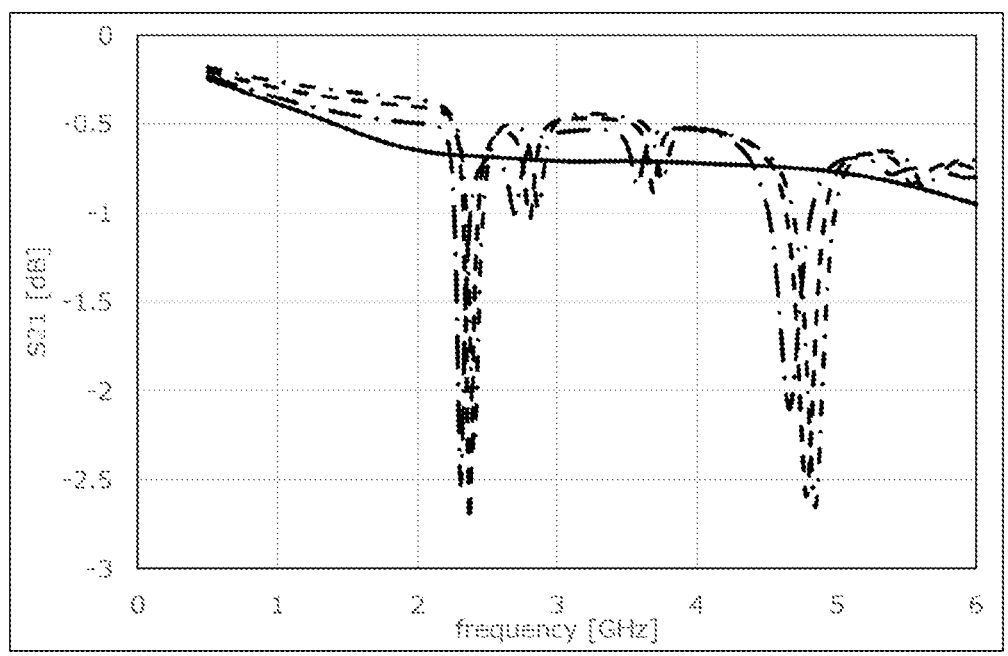
FIG. 8 is a second view illustrating the third simulation result.

FIG. 8 is a second view illustrating the third simulation result. FIG. 8 illustrates simulation of S21 (dB) in a case where a high frequency signal was transmitted through the RF signal line 15 in a state where no connection member 61 was provided. A vertical axis in FIG. 8 indicates S21 (dB), and a horizontal axis indicates a frequency (GHz). In FIG. 8, a solid line indicates a state where no sheet metal 51 is provided, a loosely dashed-dotted line indicates a state where the distance L between the printed circuit board 1A and the sheet metal 51 is 0.5 mm, a broken line indicates a state where the distance L between the printed circuit board 1A and the sheet metal 51 is 1.0 mm, and a densely dashed-dotted line indicates a state where the distance L between the printed circuit board 1A and the sheet metal 51 is 1.5 mm. In view of FIG. 8, it can be understood that it is difficult to suppress a ripple even if the distance between the printed circuit board 1A and the sheet metal 51 is adjusted in a case where no connection member 61 is provided.

Figure 9:
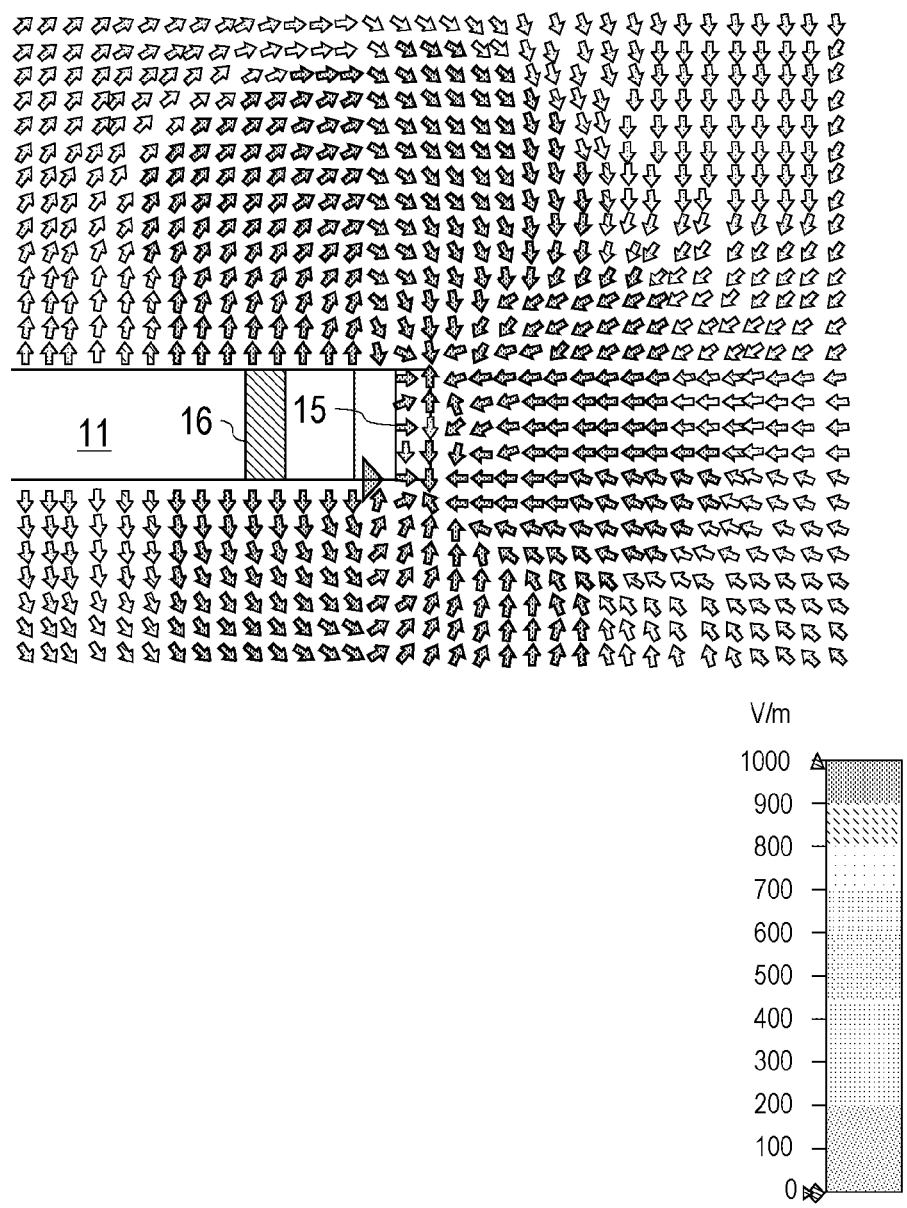
FIG. 9 is a first view schematically illustrating an electric field distribution in a case where a high frequency signal is transmitted to an RF signal line.
Figure 10:
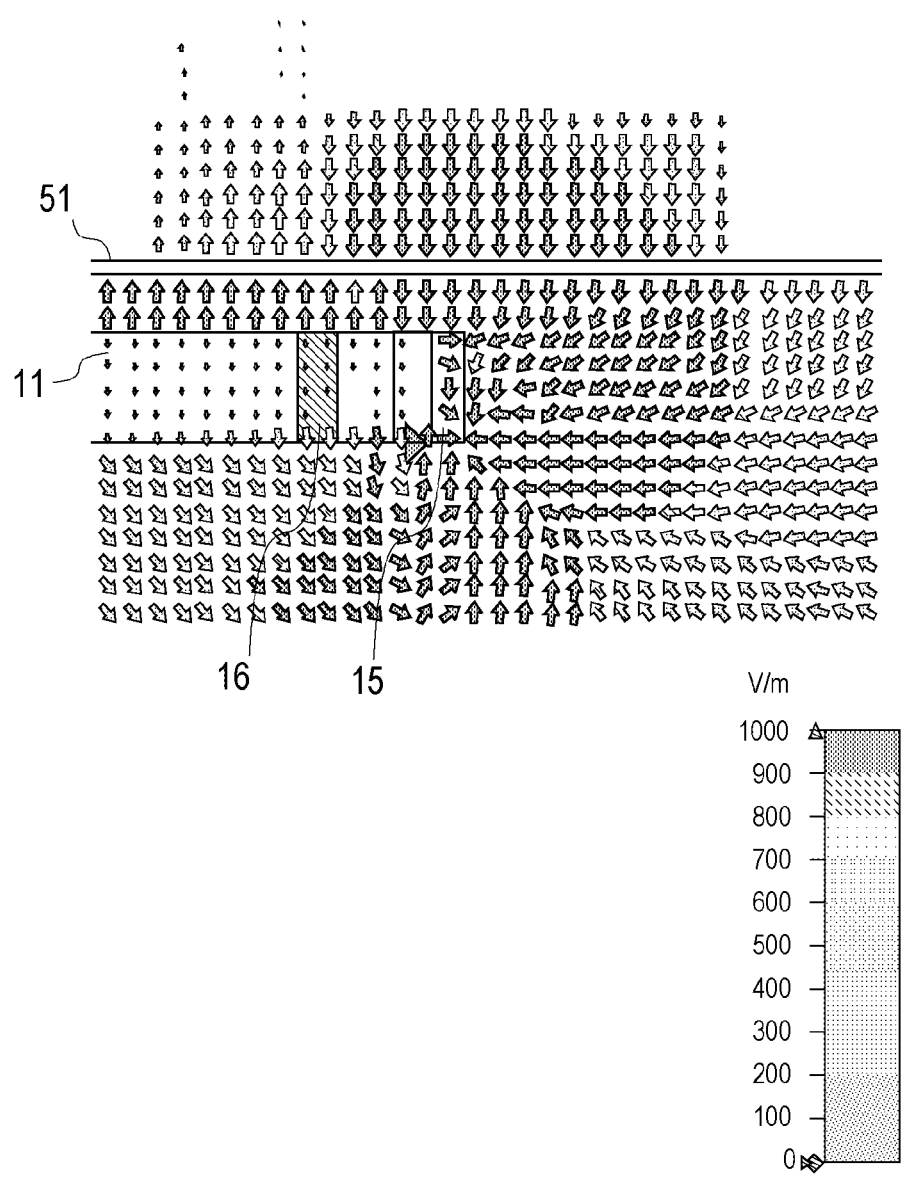
FIG. 10 is a second view schematically illustrating an electric field distribution in a case where a high frequency signal is transmitted to an RF signal line.
Figure 11:
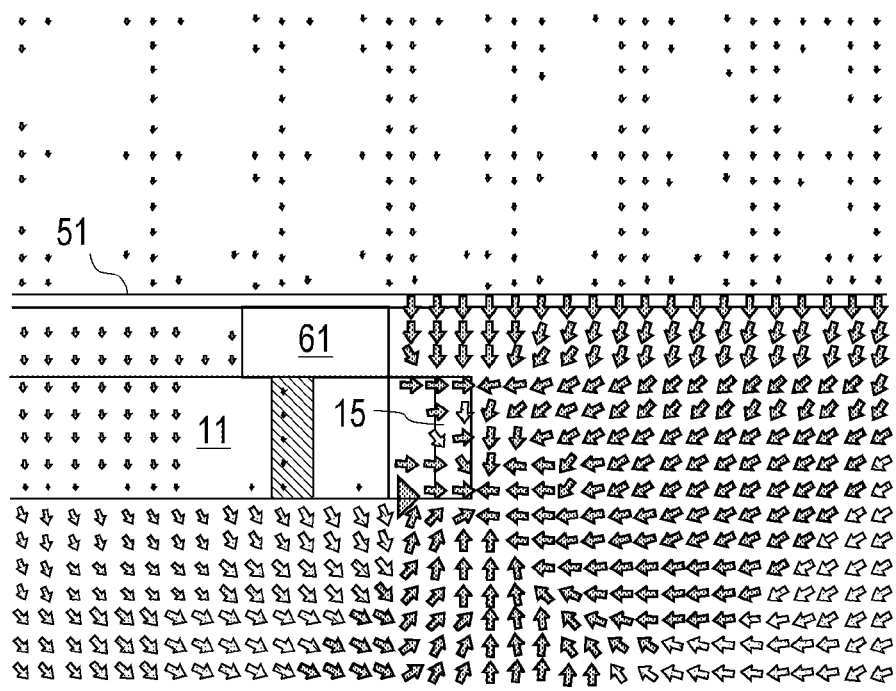
FIG. 11 is a third view schematically illustrating an electric field distribution in a case where a high frequency signal is transmitted to an RF signal line.
Figure 11:
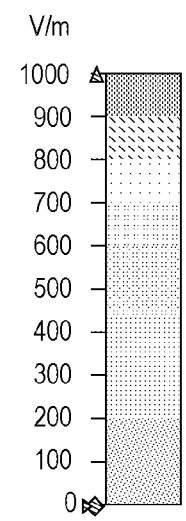
Figure 12:
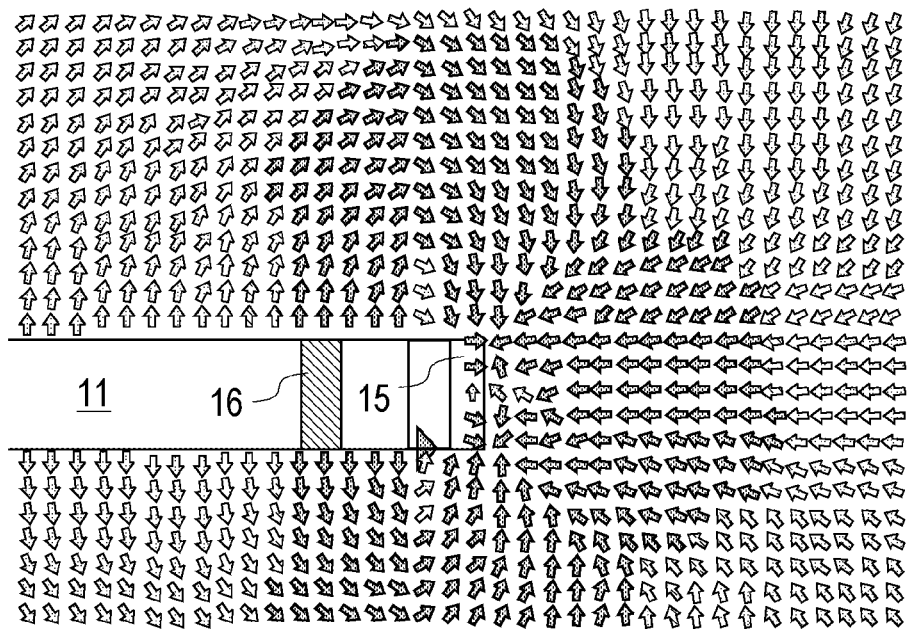
FIG. 12 is a fourth view schematically illustrating an electric field distribution in a case where a high frequency signal is transmitted to an RF signal line.
Figure 12:
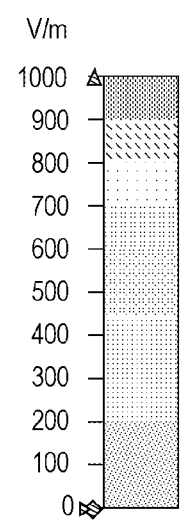
Figure 13:
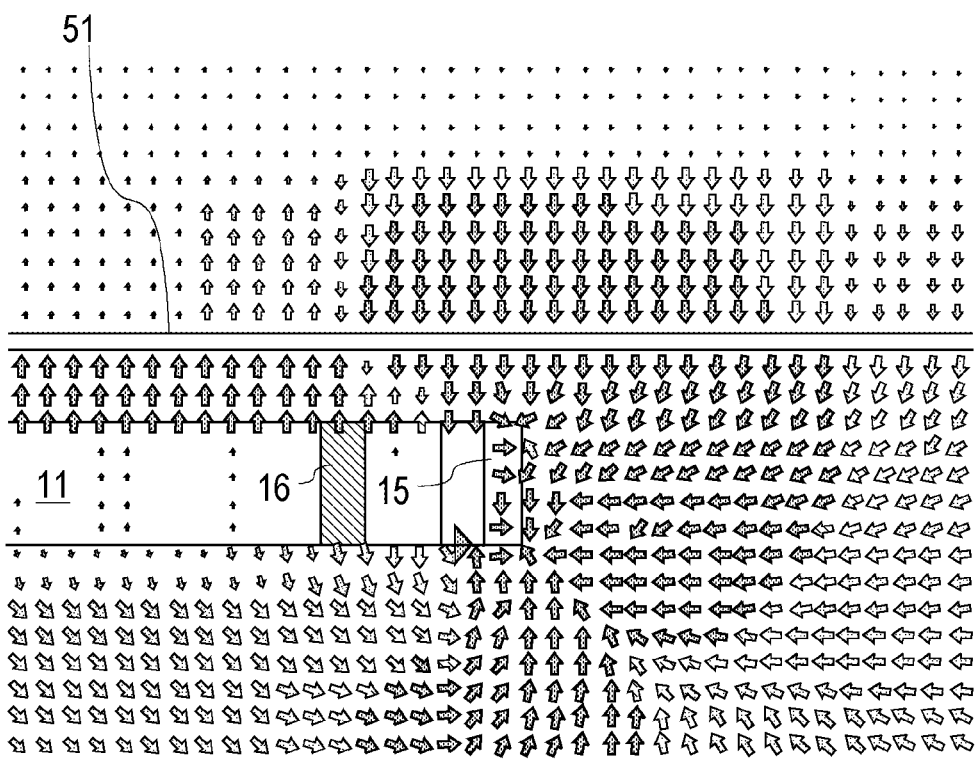
FIG. 13 is a fifth view schematically illustrating an electric field distribution in a case where a high frequency signal is transmitted to an RF signal line.
Figure 13:
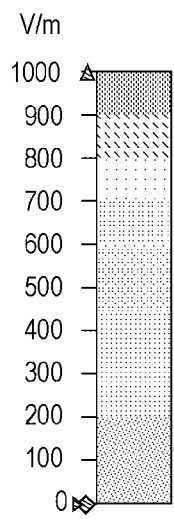
Figure 14:
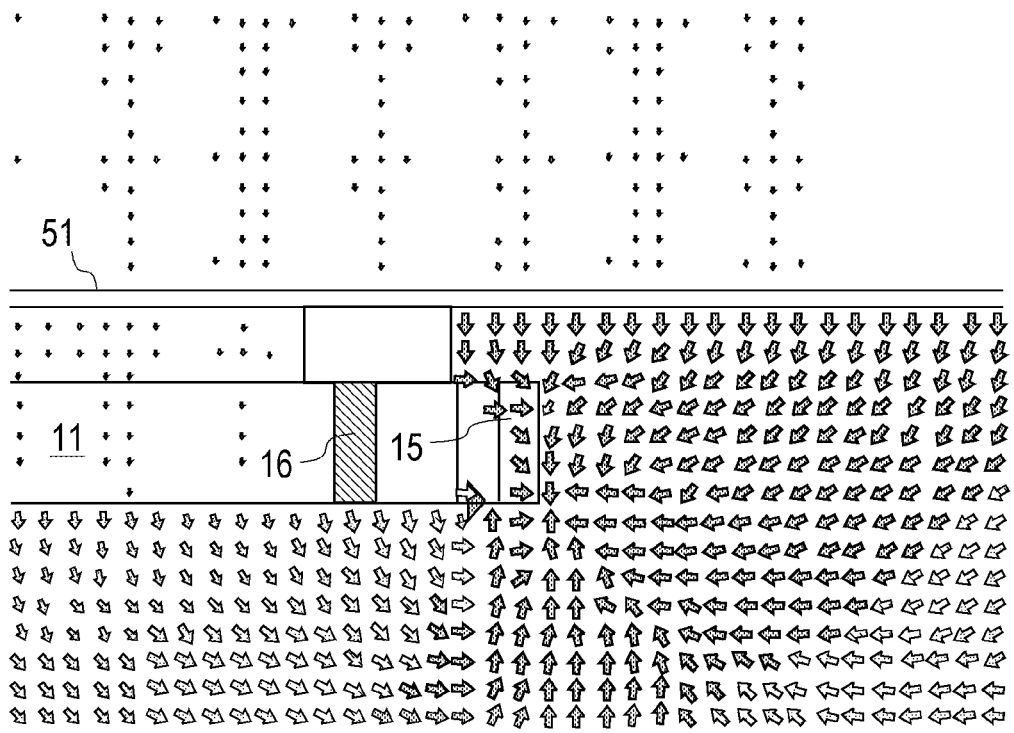
FIG. 14 is a sixth view schematically illustrating an electric field distribution in a case where a high frequency signal is transmitted to an RF signal line.
Figure 14:
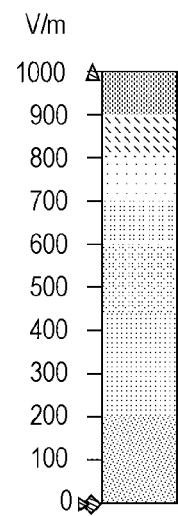

FIGS. 9 to 14 are views schematically illustrating electric field distributions in a case where a high frequency signal is transmitted through the RF signal line 15. FIGS. 9 to 11 are views schematically illustrating electric fields to be produced around the printed circuit board 1A when the high frequency signal of 5 GHz is transmitted through the RF signal line 15. Furthermore, FIGS. 12 to 14 are views schematically illustrating electric fields to be produced around the printed circuit board 1A when the high frequency signal of 2.4 GHz is transmitted through the RF signal line 15.

Furthermore, FIGS. 9 and 12 are views schematically illustrating the electric fields produced around the printed circuit board 1A. FIGS. 10 and 13 are views schematically illustrating the electric fields produced around the printed circuit board 1A in a state where the sheet metal 51 is disposed such that the interval D1 between the printed circuit board 1A and the sheet metal 51 is 0.5 mm. Note that no connection member 61 is provided in FIGS. 10 and 13. FIGS. 11 and 14 are views schematically illustrating the electric fields produced around the printed circuit board 1A in a state where the printed circuit board 1A and the sheet metal 51 are connected by the connection members 61.

In view of FIGS. 10 and 13, it can be understood that a strong electric field is produced at a position apart from the RF signal line 15 in the case where no connection member 61 is provided. Furthermore, it can be understood that a strong electric field is produced on a side opposite to the printed circuit board 1A with the sheet metal 51 interposed therebetween in the case where the sheet metal 51 is provided in the state where no connection member 61 is provided. It is thought that, due to an influence of the strong electric field produced at the position apart from the RF signal line 15, and on the side opposite to the printed circuit board 1A with the sheet metal 51 interposed therebetween, the ripples described with reference to FIGS. 3, 7, and 8 are produced.

On the other hand, in view of FIGS. 11 and 14, providing the connection members 61 suppresses the strong electric field at the position apart from the RF signal line 15 and on the side opposite to the printed circuit board 1A with the sheet metal 51 interposed therebetween. It is thought that such workings of the connection members 61 suppress the ripples described with reference to FIGS. 3, 7, and 8.

Function and Effect of Embodiment

In the present embodiment, the first ground surface 12 and the second ground surface 13 are electrically connected by the intra-substrate wirings 16. Consequently, it is possible to make the ground seen from the RF signal line 15 larger, and eventually stabilize the electric field between the RF signal line 15, the first ground surface 12, and the second ground surface 13 as much as possible. As a result, it is possible to improve characteristics of the RF signal line 15 which transmits a high frequency signal, and eventually suppress a ripple of the high frequency signal transmitted through the RF signal line 15 as much as possible.

In the present embodiment, the plurality of intra-substrate wirings 16 are aligned and disposed along the RF signal line 15. The intra-substrate wirings 16 are disposed in this way, so that it is possible to further suppress a ripple of the high frequency signal transmitted through the RF signal line 15.

In a case where the printed circuit board 1 is mounted on the smartphone 100, the sheet metal 51 such as the back surface of the housing 110 or the display 120 is disposed near the printed circuit board 1. In the present embodiment, the second ground surface 13 and the sheet metal 51 are connected by the connection members 61, so that the first ground surface 12, the second ground surface 13, and the sheet metal 51 are electrically connected. Such workings of the connection members 61 suppress characteristics for transmitting a high frequency signal through the RF signal line 15 from lowering even when the sheet metal 51 is disposed near the printed circuit board 1.

First Modified Example

Although the above-described embodiment has described the RF signal line 15 formed in the plate-like shape, the first modified example will describe an RF signal line formed in an inverted C shape. The same component as those of the embodiment will be assigned the same reference numerals, and description thereof will be omitted. The first modified example will be described below with reference to the drawings.

Figure 15:
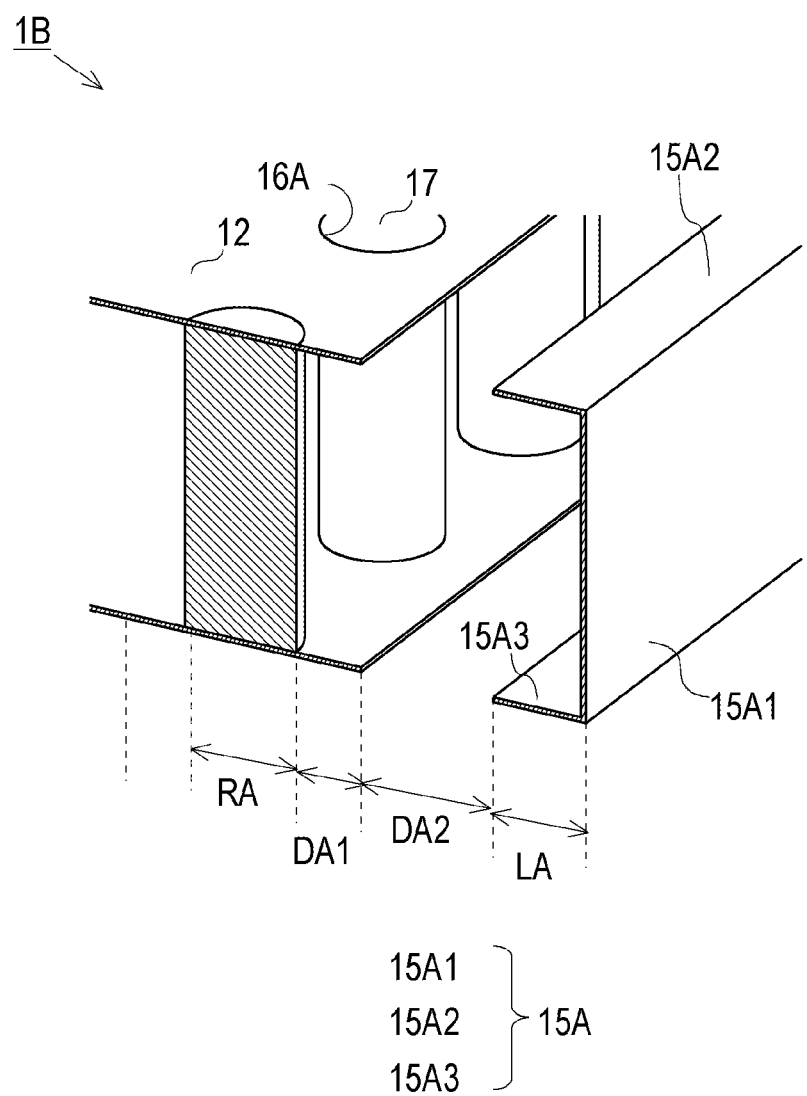
FIG. 15 is a view illustrating an example of a printed circuit board according to a first modified example.

FIG. 15 is a view illustrating an example of a printed circuit board 1B according to the first modified example. FIG. 15 is a view illustrating an enlarged area corresponding to the rectangle A in FIG. 1. In FIG. 15, the antenna spring contact 23 and the antenna connection line 24 are omitted for the sake of convenience. Furthermore, FIG. 15 illustrates as a solid line an intra-substrate wiring 16A disposed in the dielectric substrate 11 near an RF signal line 15A. The intra-substrate wirings 16A are provided in, for example, vias 17 which penetrate the dielectric substrate 11 in the thickness direction.

The RF signal line 15A includes a sidewall part 15A1, an upper wall part 15A2, and a lower wall part 15A3. The sidewall part 15A1 is disposed on the side surface of the dielectric substrate 11, and is formed in a plate-like shape. The upper wall part 15A2 is disposed on the first ground surface 12 of the dielectric substrate 11, has one end part connected to an upper end (first ground surface 12 side) of the sidewall part 15A1, and is formed in a plate-like shape. The lower wall part 15A3 is disposed on the second ground surface 13 of the dielectric substrate 11, has one end part connected to a lower end (second ground surface 13 side) of the sidewall part 15A1, and is formed in a plate-like shape. That is, the RF signal line 15A is formed in an inverted C shape seen from a length direction thereof. The sidewall part 15A1 is an example of the "first wall part". The upper wall part 15A2 is an example of the "upper wall part". The lower wall part 15A3 is an example of the "lower wall part".

Simulation has been conducted to inspect characteristics of the printed circuit board 1B. Simulation results will be described below with reference to the drawings. According to this simulation, the dielectric substrate 11 is a stacked substrate formed by stacking 12 substrates whose relative permittivity is 3.80, whose tanδ is 0.015, and whose thickness is 0.045 mm, and disposing a center substrate whose relative permittivity is 4.20 and whose tanδ is 0.015 between the sixth and seventh substrates. Furthermore, according to this simulation, a diameter RA of the via 17 is 0.3 mm, a distance DA1 from the via 17 to the side surface of the dielectric substrate 11 on which the RF signal line 15 is provided is 0.5 mm, and a distance DA2 between the upper wall part 15A2 and the lower wall part 15A3, and the dielectric substrate 11 is 0.25 mm. Furthermore, lengths LA of the upper wall part 15A2 and the lower wall part 15A3 are 0.25 mm.

Figure 16:
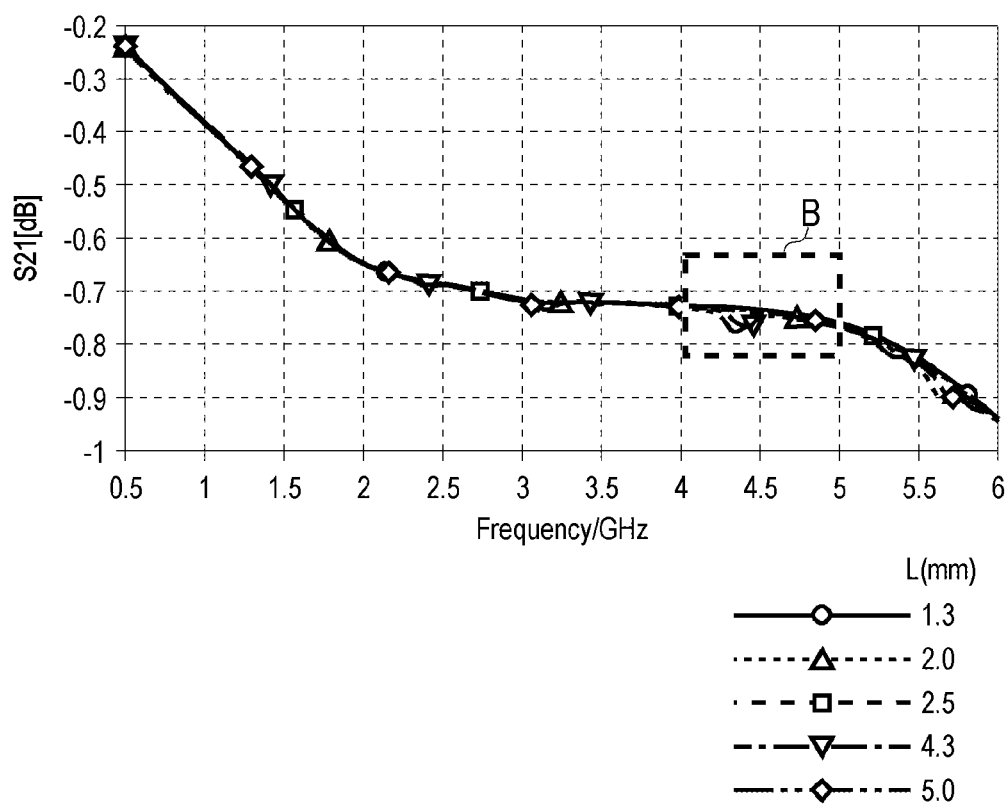
FIG. 16 is a first view illustrating a fourth simulation result obtained by checking S21 of an RF signal line in a case where a distance between adjacently disposed intra-substrate wirings 16A is varied.

FIG. 16 is a view illustrating a fourth simulation result obtained by checking S21 of an RF signal line 15B in a case where the distance L between the adjacently disposed intra-substrate wirings 16A was varied. A vertical axis in FIG. 16 indicates S21 (dB), and a horizontal axis indicates a frequency (Hz). Furthermore, FIG. 17 is a view illustrating an enlarged area of a rectangle B in FIG. 16.

Figure 17:
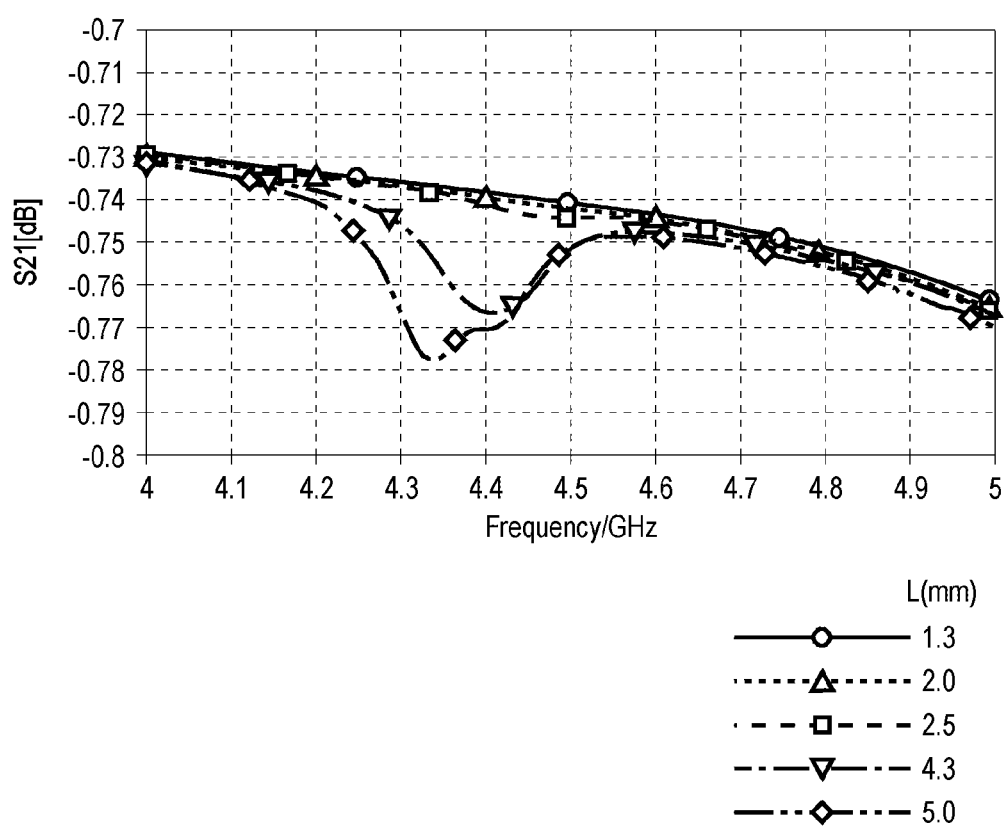
FIG. 17 is a second view illustrating the fourth simulation result obtained by checking S21 of an RF signal line 15 in a case where a distance between the RF signal line and intra-substrate wirings is varied.

In view of FIGS. 16 and 17, it can be understood that a ripple is produced in part of a frequency range (e.g., a range of 4.2 GHz to 4.6 GHz) in a range where the distance L exceeds 2.0 mm. That is, according to the first modified example adopting the RF signal line 15B, the distance L is preferably 2.5 mm or less.

Furthermore, according to the first modified example, it is possible to more easily form the RF signal line on the side surface of the dielectric substrate 11 than the RF signal line 15 according to the embodiment by using the upper wall part 15A2 and the lower wall part 15A3 as electrodes for plating processing.

Second Modified Example

Although the first modified example has described the RF signal line 15A formed in the inverted C shape seen from the length direction, the second modified example will describe an RF signal line formed in a comb shape seen from the length direction.

Figure 18:
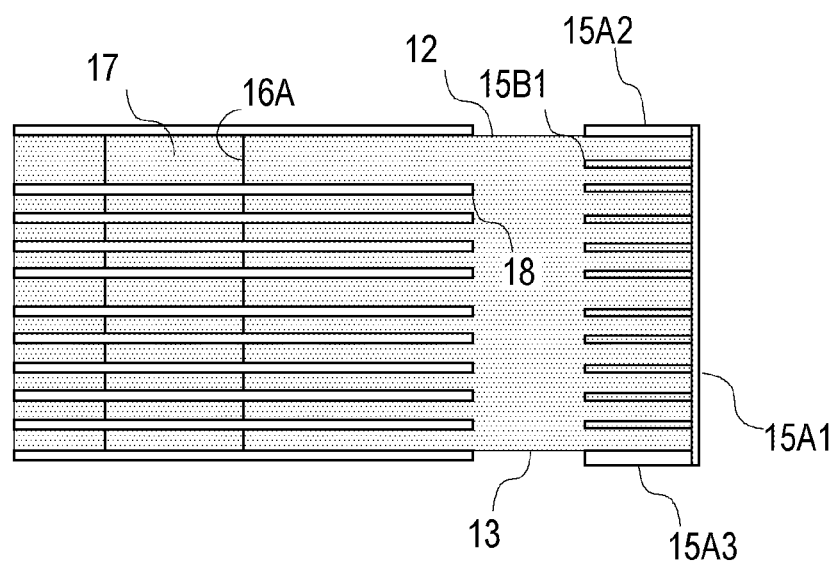
FIG. 18 is a view illustrating an example of a printed circuit board according to a second modified example.
Figure 18:
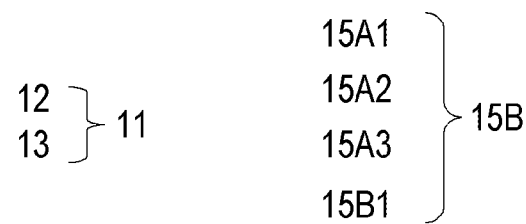

FIG. 18 is a view illustrating an example of a printed circuit board 1C according to the second modified example. FIG. 18 is a view illustrating an area corresponding to the rectangle A of the printed circuit board 1C seen from the length direction of the RF signal line 15B. In FIG. 18, protrusion parts 15B1 disposed in the dielectric substrate 11 are also illustrated to be seen through seen from the length direction of the RF signal line 15B. Furthermore, FIG. 18 illustrates on-substrate wirings 18, too, disposed on each substrate stacked on the dielectric substrate 11 and connected to the intra-substrate wirings 16A.

The RF signal line 15B is the RF signal line formed by disposing the plurality of protrusion parts 15B1 between the upper wall part 15A2 and the lower wall part 15A3 of RF signal line 15A. The protrusion part 15B1 is disposed such that one end is connected with the sidewall part 15A1, and another end extends toward the dielectric substrate 11.

Figure 19:
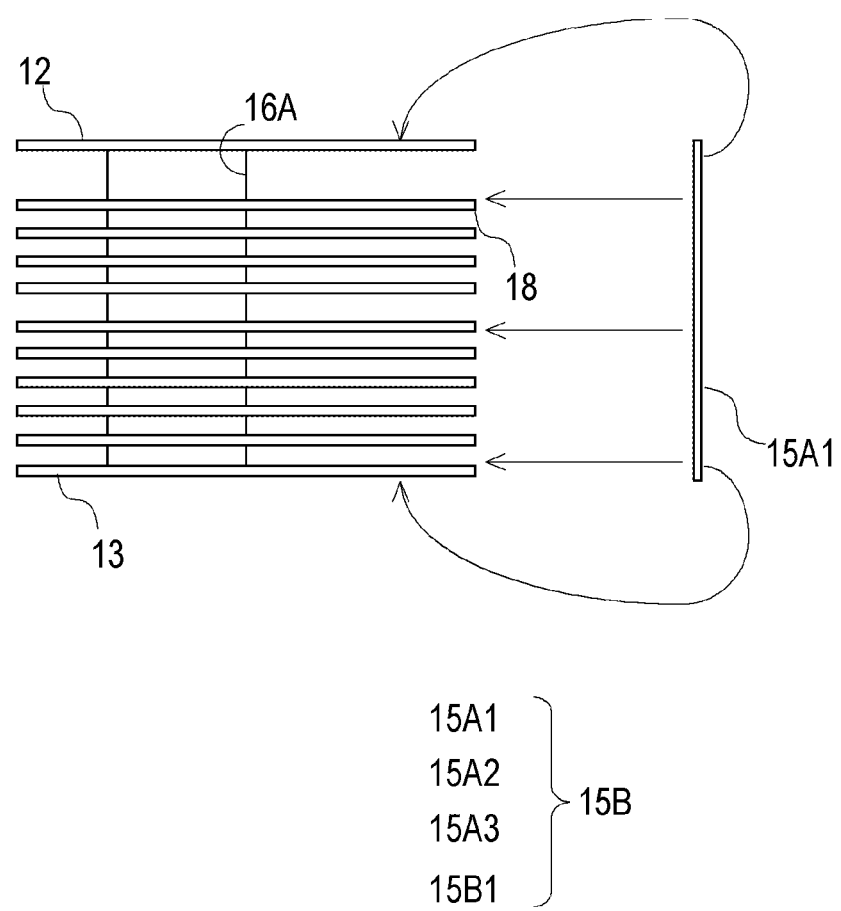
FIG. 19 is a first view schematically illustrating an electric field near an RF signal line.
Figure 20:
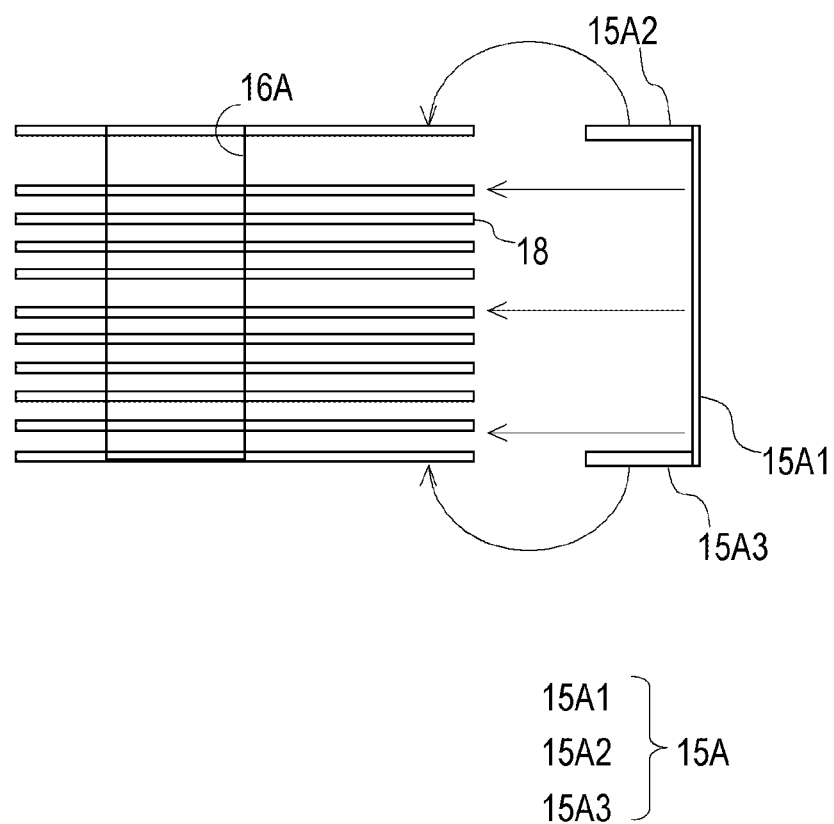
FIG. 20 is a second view schematically illustrating an electric field near an RF signal line.
Figure 21:
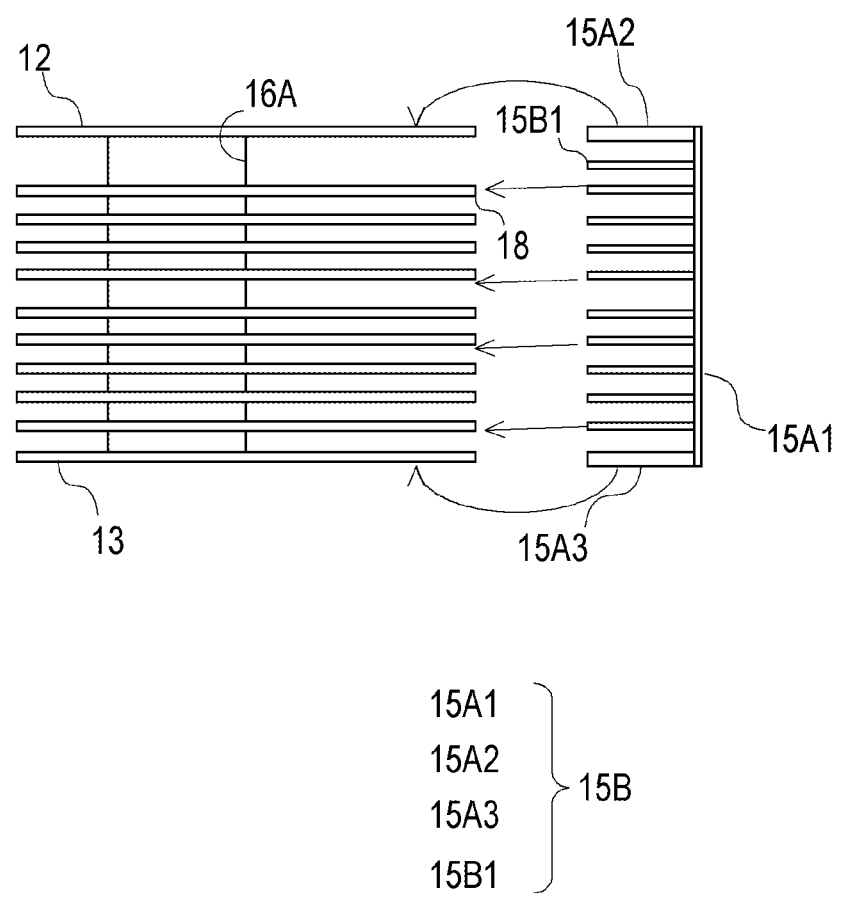
FIG. 21 is a third view schematically illustrating an electric field near an RF signal line.

FIGS. 19 to 21 are views schematically illustrating electric fields near an RF signal line. FIGS. 19 to 21 schematically illustrate the electric fields as arrows. FIG. 19 schematically illustrates an electric field distribution in a state where the sidewall part 15A1 (corresponding to the RF signal line 15 according to the embodiment) is disposed on the side surface of the dielectric substrate 11. FIG. 20 schematically illustrates an electric field distribution in a state where the RF signal line 15A according to the first modified example is disposed on the side surface of the dielectric substrate 11. FIG. 21 schematically illustrates an electric field distribution in a state where the RF signal line 15B according to the second modified example is disposed on the side surface of the dielectric substrate 11.

As is understandable upon comparison of FIGS. 19 to 21, expansion of the electric fields becomes smaller in order of the sidewall part 15A1>the RF signal line 15A>the RF signal line 15B. That is, it can be understood that the RF signal line 15A as a signal line radiates a less unnecessary radio wave than the sidewall part 15A1, and the RF signal line 15B as a signal line radiates a less unnecessary radio wave than the RF signal line 15A.

Figure 22:
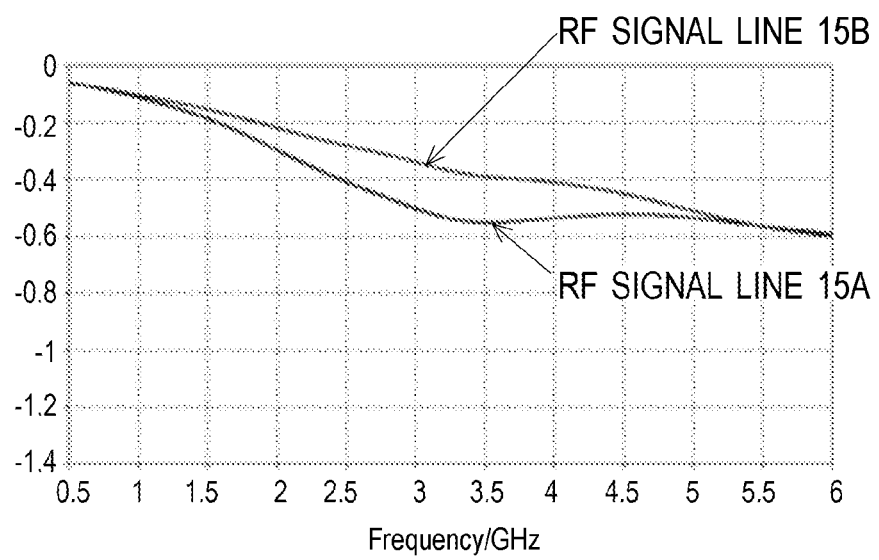
FIG. 22 is a view for comparing characteristics of the RF signal line according to the first modified example, and characteristics of the RF signal line according to the second modified example.

FIG. 22 is a view for comparing characteristics of the RF signal line 15A according to the first modified example, and characteristics of the RF signal line 15B according to the second modified example. A vertical axis in FIG. 22 indicates S21 (dB), and a horizontal axis indicates a frequency (Hz). In view of FIG. 22, it can be understood that the RF signal line 15B has better characteristics than those of the RF signal line 15A.

According to the second modified example, it is possible to provide an RF signal line having better characteristics than those of the RF signal line 15A.

Third Modified Example

Figure 23:
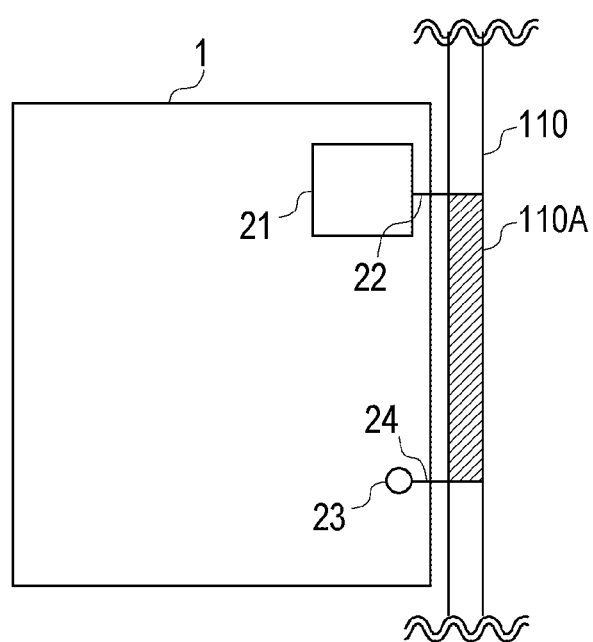
FIG. 23 is a view illustrating an example of disposition of a printed circuit board 1 and a housing 110 accommodated in a smartphone 100.

In the above-described embodiment, the RF signal line 15 is formed by, for example, plating. However, the RF signal line 15 may be formed by methods other than plating. FIG. 23 is a view illustrating an example of disposition of the printed circuit board 1 and the housing 110 accommodated in the smartphone 100. The housing 110 is formed by, for example, metal whose thickness is 10 mm or less. The printed circuit board 1 may use as the RF signal line 15 a part 110A (illustrated as diagonal lines in FIG. 23) of the housing 110 disposed near the side surface of the printed circuit board 1. In this case, the part 110A and the RF circuit 21 may be connected by the circuit connection line 22, and the part 110A and the antenna spring contact 23 may be connected by the antenna connection line 24.

Although the connection members 61 are disposed at five portions in the above-described embodiment, the connection members 61 may be disposed at six portions or more, or may be disposed at four portions or less. Note that the connection members 61 may be provided at three portions including a portion (port 151) at which the RF signal line 15 is connected to the RF circuit 21, a portion (port 152) at which the RF signal line 15 is connected to the antenna spring contact 23, and a portion between the port 151 and the port 152.

According to the disclosed technique, it is possible to suppress a ripple produced in a signal to be transmitted even when a signal line for transmitting a high frequency signal is disposed at a board outer circumferential part.

The above-disclosed embodiment and modified examples can be respectively combined.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A printed circuit board comprising:
    a dielectric substrate which is formed in a plate-like shape;
    ground conductor layers which are respectively provided on a top surface and a back surface of the dielectric substrate;
    a signal line which is provided on a side surface of the dielectric substrate, and transmits a high frequency signal; and
    a plurality of connection conductors which are provided in the dielectric substrate, connects the ground conductor layer provided on the top surface and the ground conductor layer provided on the back surface, and are aligned and disposed along the signal line.

2. The printed circuit board according to claim 1, wherein an interval between the neighboring connection conductors of the plurality of connection conductors is 0.5 mm or less.

3. The printed circuit board according to claim 1, wherein the signal line includes
    a first wall part which is disposed on the side surface of the dielectric substrate,
    an upper wall part which is disposed on the top surface of the dielectric substrate and is connected to one end part of the first wall part, and a lower wall part which is disposed on the back surface of the dielectric substrate and is connected to another end part of the first wall part.

4. The printed circuit board according to claim 3, wherein the signal line includes a plurality of protrusion parts which are disposed between the upper wall part and the lower wall part and protrude from the first wall part to the dielectric substrate.

5. The printed circuit board according to claim 3, wherein an interval between the neighboring connection conductors of the plurality of connection conductors is 2.5 mm or less.

6. The printed circuit board according to claim 1, wherein the connection conductors each are formed of a via or a through-hole formed in a thickness direction of the dielectric substrate.

7. The printed circuit board according to claim 1, wherein the signal line is formed by plating.

8. The printed circuit board according to claim 1, wherein the signal line connects an antenna contact which is connected to an antenna used to transmit and receive the high frequency signal, and a processing circuit which performs signal processing on the high frequency signal transmitted and received via the antenna.

9. A wireless communication terminal comprising the printed circuit board according to claim 1.

10. The wireless communication terminal according to claim 9, further comprising:
   a plate-like conductor plate; and
   a connection member which electrically connects the ground conductor layer provided on the back surface, and the conductor plate.

11. The wireless communication terminal according to claim 10, further comprising a housing which is formed of a conductor,
   wherein the signal line is formed of a part of the housing disposed adjacent to the side surface.

12. A wireless communication terminal comprising the printed circuit board according to claim 2.

13. A wireless communication terminal comprising the printed circuit board according to claim 3.

14. A wireless communication terminal comprising the printed circuit board according to claim 4.

15. A wireless communication terminal comprising the printed circuit board according to claim 5.

16. A wireless communication terminal comprising the printed circuit board according to claim 6.

17. A wireless communication terminal comprising the printed circuit board according to claim 7.

18. A wireless communication terminal comprising the printed circuit board according to claim 8.

* * * * *